United States Patent
Vuckovic et al.

(10) Patent No.: US 7,292,613 B2
(45) Date of Patent: Nov. 6, 2007

(54) HALF-WAVELENGTH MICROPOST MICROCAVITY WITH ELECTRIC FIELD MAXIMUM IN THE HIGH-REFRACTIVE-INDEX MATERIAL

(75) Inventors: Jelena Vuckovic, Palo Alto, CA (US); Yoshihisa Yamamoto, Stanford, CA (US)

(73) Assignees: The Board of Trustees of the Leland Stanford Junior University, Palo Alto, CA (US); Japan Science and Technology, Kawaguchi, Saitama Pref. (JP)

( * ) Notice: Subject to any disclaimer, the term of this patent is extended or adjusted under 35 U.S.C. 154(b) by 1001 days.

(21) Appl. No.: 10/631,665

(22) Filed: Jul. 30, 2003

(65) Prior Publication Data
US 2007/0183471 A1 Aug. 9, 2007

Related U.S. Application Data

(60) Provisional application No. 60/399,913, filed on Jul. 30, 2002.

(51) Int. Cl.
*H01S 5/00* (2006.01)
(52) U.S. Cl. ...................... 372/43.01; 372/39
(58) Field of Classification Search ............ 372/43.01, 372/39
See application file for complete search history.

(56) References Cited

U.S. PATENT DOCUMENTS 6,687,274 B2 * 2/2004 Kahen .................. 372/39
2002/0163947 A1 * 11/2002 Ostergaard et al. ...... 372/43

* cited by examiner

*Primary Examiner*—Dung Nguyen
(74) *Attorney, Agent, or Firm*—Lumen Intellectual Property Services, Inc.

(57) ABSTRACT

A micropost microcavity device has a maximum field intensity at the center of a high-index spacer as well as a small mode volume. The device has an approximately half-wavelength thick low-index spacer [400] sandwiched between two quarter wave stacks [410, 420]. The low-index spacer has a high-index subspacer layer [470] positioned at its center. The subspacer layer has a thickness smaller than a quarter wavelength. As a result, the electric field intensity remains a maximum at the center of the spacer where the high-index subspacer is positioned. A quantum dot or other active region [480] may be embedded within the subspacer [470]. The microcavity devices provide, for example, single photon sources, single dot lasers, low-threshold quantum dot or quantum well lasers, or devices for strong coupling between a single quantum dot and the cavity field which can be used as components of photonic integrated circuits, quantum computers, quantum networks, or quantum cryptographic systems.

17 Claims, 6 Drawing Sheets

HALF-WAVELENGTH MICROPOST MICROCAVITY WITH ELECTRIC FIELD MAXIMUM IN THE HIGH-REFRACTIVE-INDEX MATERIAL

CROSS-REFERENCE TO RELATED APPLICATIONS

This application claims priority from U.S. provisional patent application 60/399,913 filed Jul. 30, 2002, which is incorporated herein by reference.

FIELD OF THE INVENTION

The present invention relates generally to optical devices and components. More specifically, it relates to photonic crystal microcavities, distributed-Bragg-reflector micropost microcavities, and related devices.

BACKGROUND OF THE INVENTION

Photonic crystal microcavities exhibiting cavity quantum electrodynamic (QED) phenomena can be used to construct optical devices such as high-efficiency light emitting diodes, low-threshold lasers, and single photon sources. During the growth process of a solid-state microcavity, a single narrow-linewidth emitter (quantum dot) can be embedded in the device, enabling cavity-field interaction with the quantum dot. The coupling between the quantum dot and the electric field in the cavity enhances the radiative transition rate of the quantum dot. The coupling is enhanced by a strong electric field intensity located at the quantum dot. The coupling is also increased if the volume of the fundamental electromagnetic mode in the cavity is small. Thus, for many applications of microcavities, it is desirable that the microcavity has a high quality factor (Q) and a low mode volume (V) for the fundamental mode. In other words, it is desirable that the ratio Q/V is large. For example, increasing Q/V can lead to a reduction in laser threshold. Controlling the Q/V is also useful in single-photon sources for enhancing the coupling efficiency of the dot to an output mode of interest.

Figure 1A:
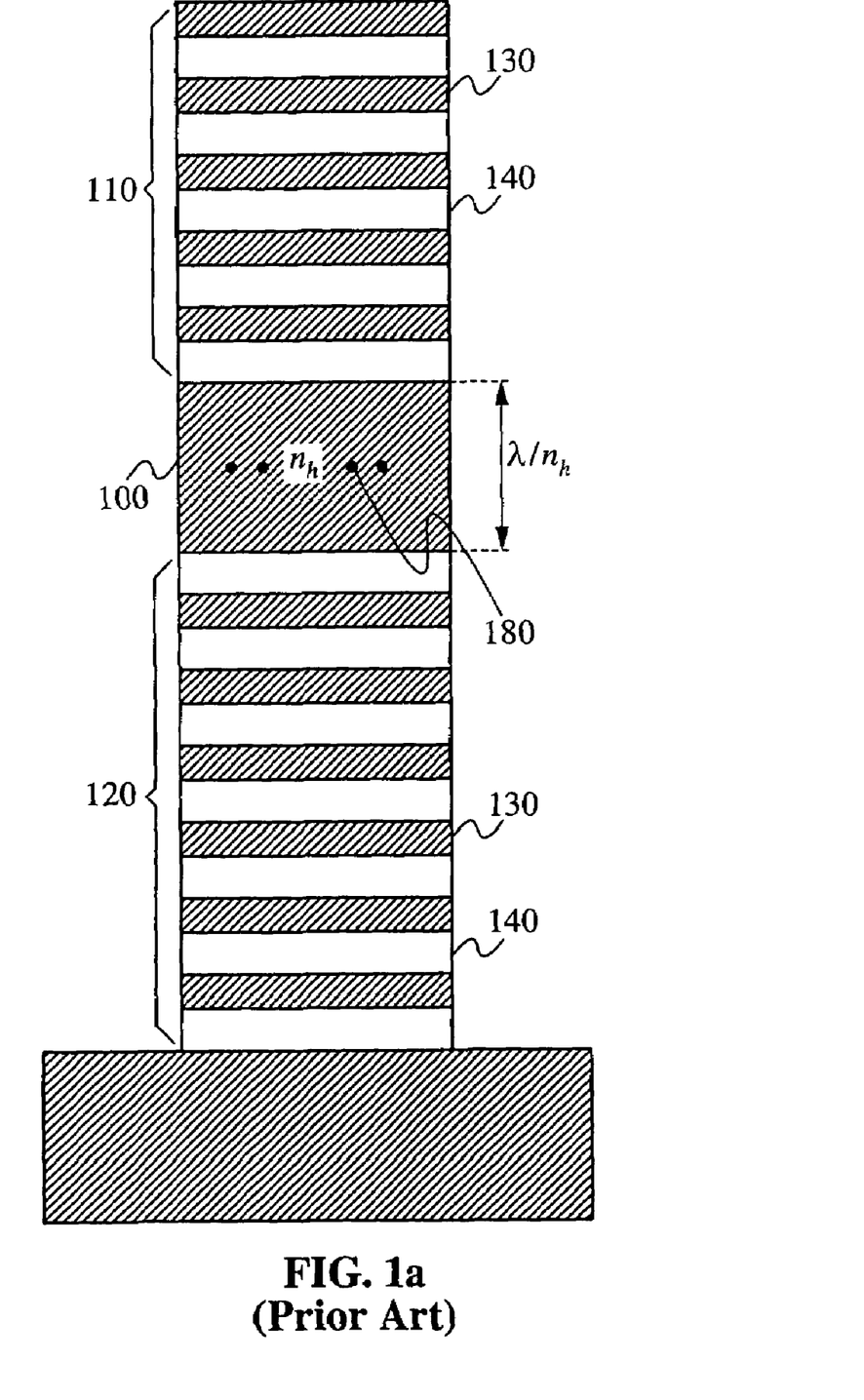
FIG. 1a is a cross-sectional view of a conventional cylindrical micropost microcavity design having a high-index spacer thickness of approximately one wavelength.

A standard microcavity is the cylindrical micropost design, as illustrated in FIG. 1a. The micropost microcavity has a spacer region 100 positioned between two dielectric mirrors, a top mirror 110 and a bottom mirror 120. One or more quantum dots, or one or more quantum wells 180 are embedded at the center of the spacer region 100. The dielectric mirrors 110 and 120 are distributed Bragg reflectors (DBRs) made by stacking quarter-wave thick layers of alternating high index ($n_h$) material 130 and low index ($n_l$) material 140. In fabricating the device, alternating high and low index quarter-wave layers are deposited, and the spacer region 100 is made by increasing the thickness of a high index layer to a full wavelength ($\lambda/n_h$). Presently used quantum dots or quantum well materials are required to be embedded in the high refractive index material (for example, $In_xGa_{1-x}As$ quantum dots or quantum wells embedded in GaAs, with emission wavelength typically ranging from 900 nm to 980 nm, or $In_xGa_{1-x}As_yN_{1-y}$ quantum wells embedded in GaAs, with emission wavelength ranging from 1300 nm to 1550 nm). The spacer region 100 is thus preferably a high-refractive index material. To maximize the quality factor, the spacer normally is designed to have a thickness of one wavelength ($\lambda/n_h$). Light at the device operating wavelength $\lambda$ is confined to the structure by the combination of distributed Bragg reflection in the longitudinal (vertical) direction, and total internal reflection in the transverse (horizontal) direction. The electromagnetic mode of interest is the fundamental ($HE_{11}$) mode.

Figure 1B:
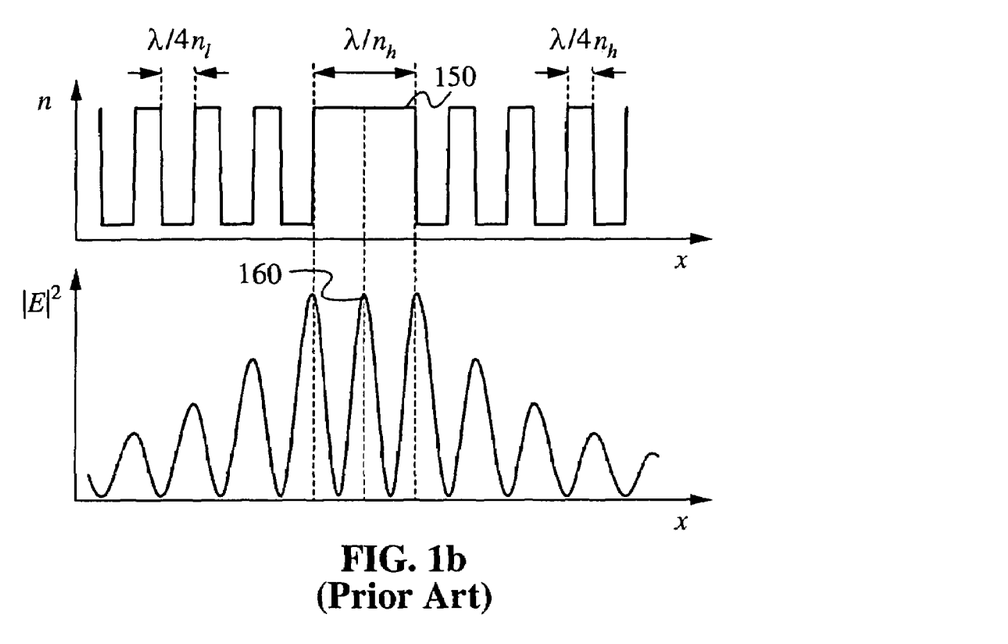

FIG. 1b is a graph of refractive index and corresponding electric field intensity along the longitudinal length of the device shown in FIG. 1a. The electric field intensity is a maximum 160 at the center of the high refractive index spacer region 150. This device, therefore, advantageously combines a high-index spacer and maximum field intensity at the center of the spacer where the active layer (quantum dot or quantum well) is located. However, although the Q factor for this design is high, it has the disadvantage that the mode volume V is large due to the wavelength-thick spacer region, and this large mode volume offsets the high quality factor.

Figure 2A:
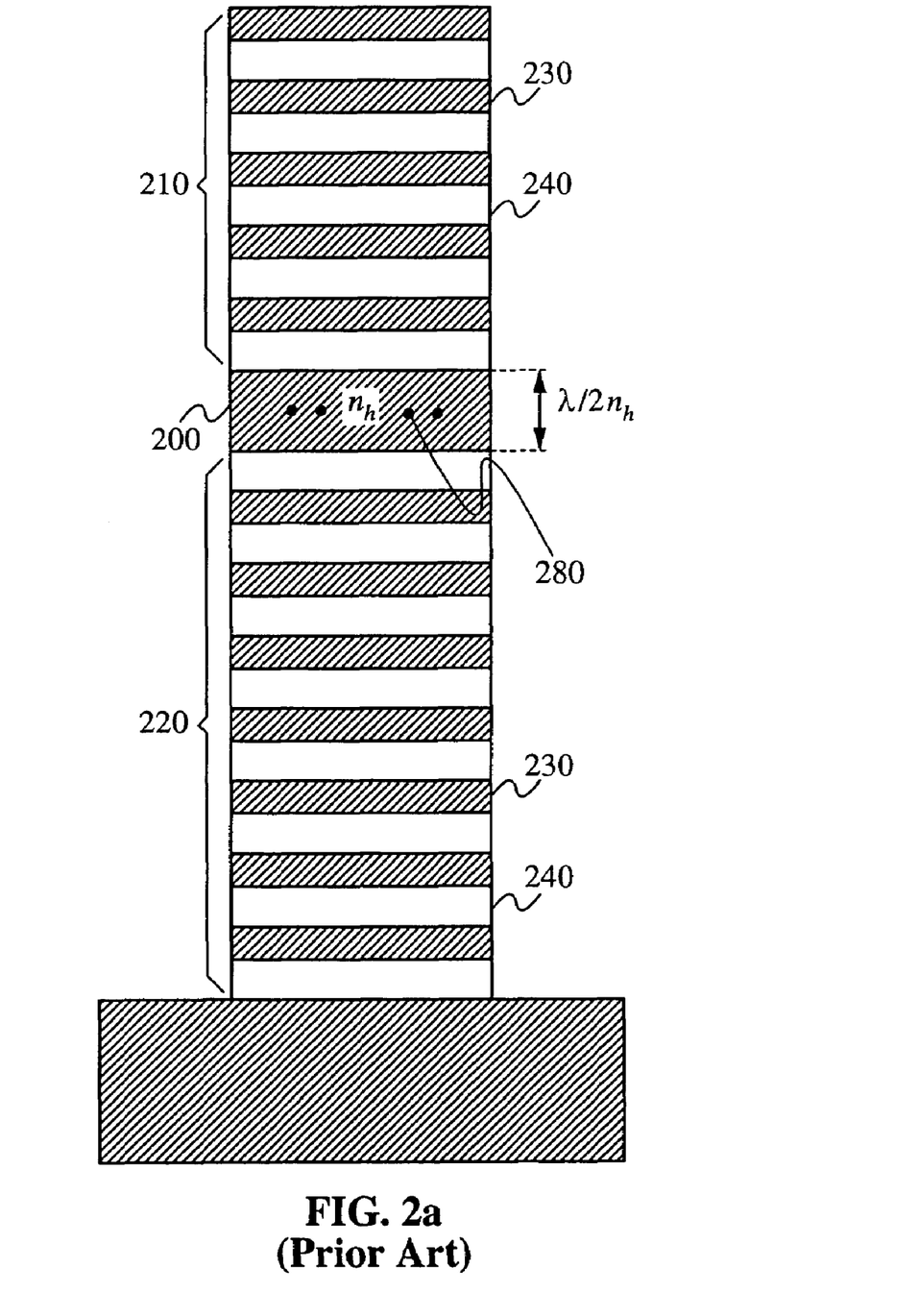
FIG. 2a is a cross-sectional view of an alternative cylindrical micropost microcavity design, according to conventional design principles, wherein the high-index spacer thickness is approximately half a wavelength.
Figure 2B:
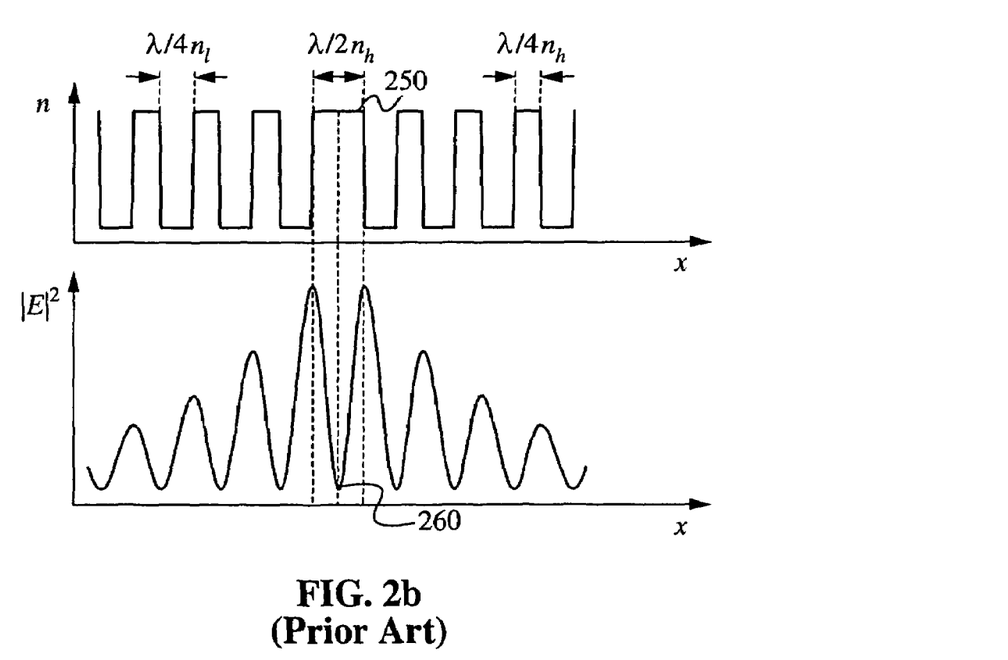

To reduce the mode volume, one could design an alternative micropost microcavity as shown in FIG. 2a. The micropost of FIG. 2a has a high-refractive index spacer region 200 whose thickness is a half-wavelength. An active region 280 comprising, for example, quantum dots or quantum wells, is embedded in the spacer region 200. As with the device of FIG. 1a, the spacer region 200 is sandwiched between top 210 and bottom 220 DBR mirrors made of quarter-wave stacks of alternating high refractive index material 230 and low refractive index material 240. FIG. 2b is a graph of refractive index and corresponding electric field intensity for the design of FIG. 2a. As illustrated in the graphs, the electric field intensity is at a minimum 260 at the center of the high-refractive index region 250. Thus, although the mode volume is smaller in this design, the electric field intensity is at a minimum where the active layer is located. Because the electric field will not interact with the active layer, this design is not useful. Moreover, it is impossible to relocate the active layer to the field maximum, as the maximum is in the low index material.

Figure 3A:
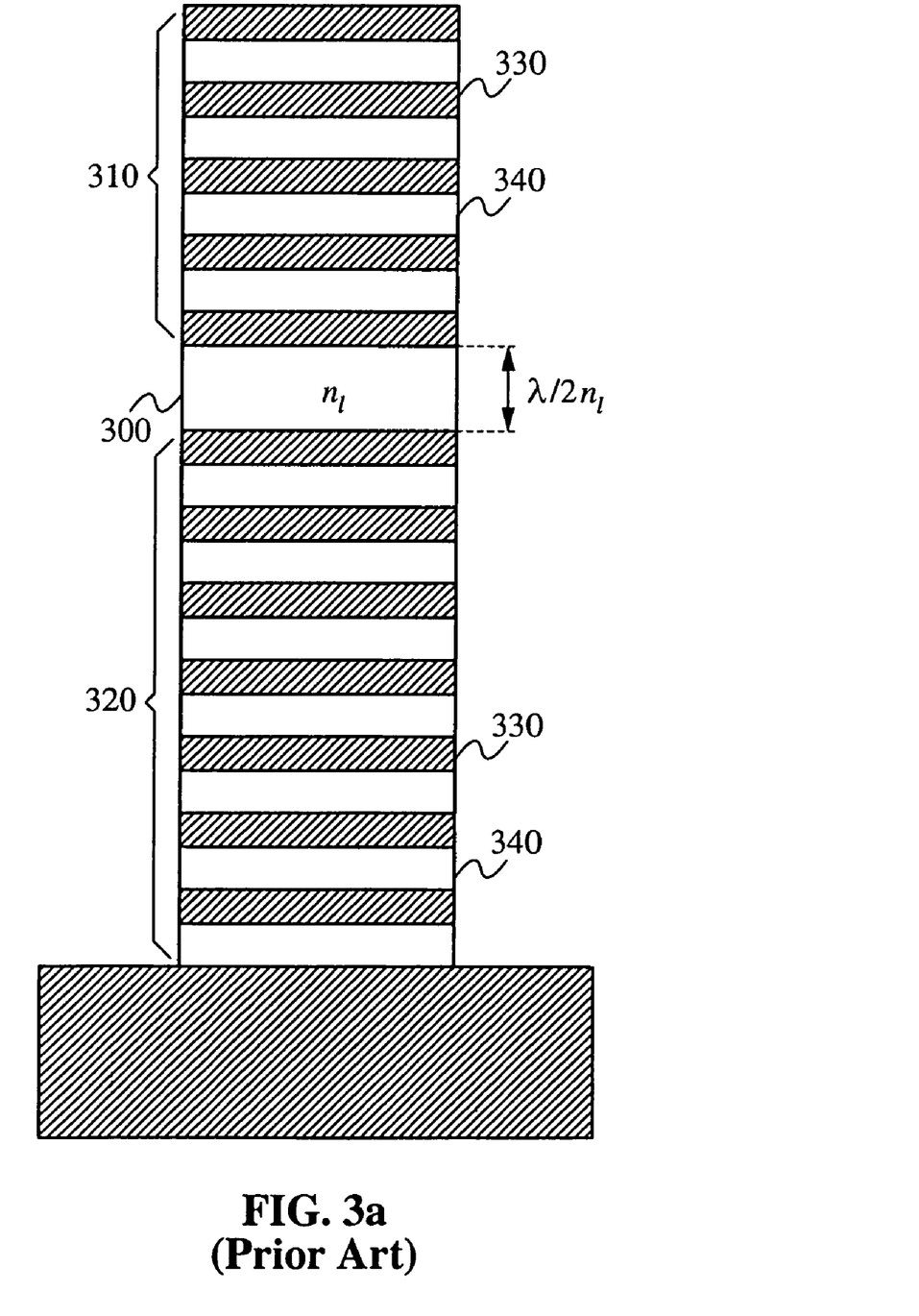
FIG. 3a is a cross-sectional view of an alternative cylindrical micropost microcavity design, according to conventional design principles, wherein the low-index spacer thickness is approximately half a wavelength.
Figure 3B:
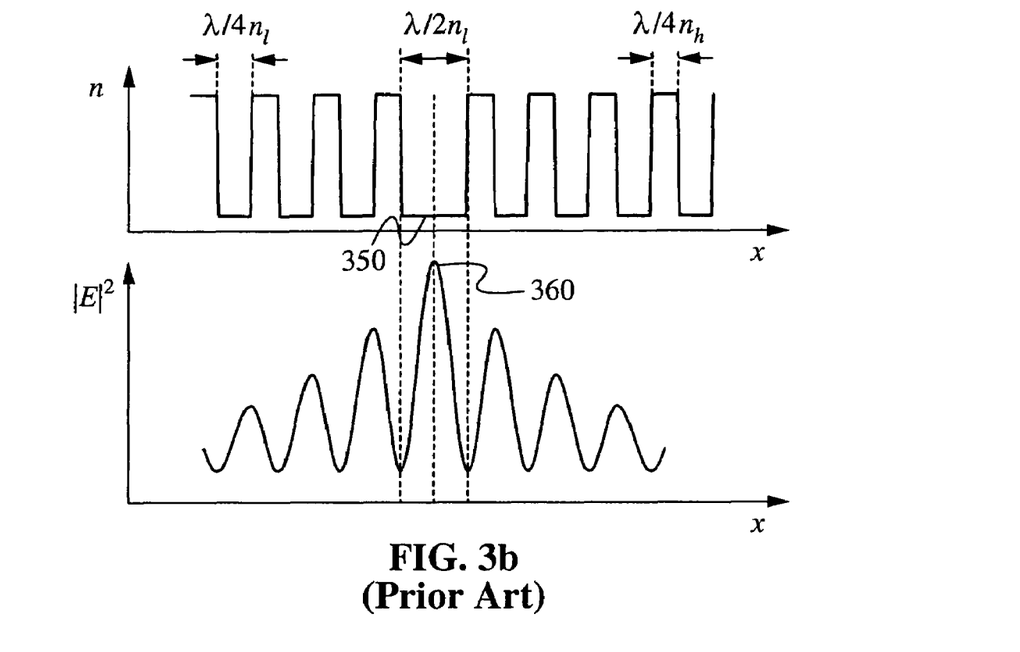

To obtain an electric field maximum in a half-wavelength spacer, one could design an alternative micropost design as shown in FIG. 3a. Like the design of FIG. 2a, this design has a half-wavelength spacer 300 sandwiched between DBR mirrors 310 and 320 made of quarter-wave stacks of high index 330 and low index 340 materials. The spacer 300 in this design, however, is made of a low index material. As a result, the electric field has a maximum 360 at the center of the low index region 350, as shown in FIG. 3b. Although this design provides an electric field maximum at the center of a half-wavelength spacer, the spacer material has a low refractive index. Because the active layer (e.g., quantum dot or quantum well) needs to be embedded in the high refractive index material, as explained previously, this design is not useful.

In summary, although it is possible to achieve a maximum field intensity at the center of a high-index spacer, as shown in the graph of FIG. 1b, this device has a large mode volume. If the mode volume is decreased by using a half-wavelength spacer, however, the resulting device either has a minimum field intensity at the center of the spacer, as shown in FIG. 2b, or has a spacer with a low refractive index that is not suitable for an embedding active layer, as shown in FIG. 3b. Thus, according to conventional design principles known in the art, it is not possible to obtain a micropost microcavity device that has a maximum field intensity at the center of a high-index spacer whose thickness is half a wavelength, i.e., it is impossible to locate an active layer at the field maximum of the device with half-wavelength spacer (of either low or high-index). Consequently, although it is desirable to design microcavity devices with higher Q/V values, the design trade-offs have prevented the realization of this goal.

SUMMARY OF THE INVENTION

Surprisingly, the present invention provides micropost microcavity devices having maximum electric field intensity in a high-index material, as well as a small mode volume. These devices have higher Q/V values than known micropost microcavity devices. According to one embodiment of the present invention, a micropost microcavity device has an approximately half-wavelength thick low-refractive index spacer with an electric field maximum at the center of the spacer. The unique spacer has a high-index subspacer layer positioned at its center. The subspacer layer has a thickness smaller than a quarter wavelength. As a result, the electric field intensity remains a maximum at the center of the spacer where the high-index subspacer is located. A micropost microcavity with infinite diameter (i.e., the planar microcavity case) is designed for operating at a wavelength $\lambda$. Because the device of this embodiment has a finite micropost diameter, the actual operating wavelength $\lambda_{op}$ for the device is blue-shifted (reduced) below the value $\lambda$ for a planar microcavity. The spacer layer is sandwiched between first and second mirrors made of quarter-wave stacks of alternating layers of a low index material and high index material. The low index material has a refractive index $n_l$, while the high index material has a refractive index $n_h$ where $n_l < n_h$. The alternating low index and high index layers have alternating quarter-wave thicknesses $\lambda/4n_l$ and $\lambda/4n_h$, respectively. The spacer is made of a low index material having refractive index $n_l$ containing at its center a subspacer layer of high-index material having refractive index $n_h$. The spacer has a thickness roughly equal to a half-wavelength $\lambda/2n_l$, and the subspacer layer has a thickness less than $\lambda/4n_h$. As a result of this unique design, the device provides a low mode volume, a high-index material at the center of the spacer, and operates with a field intensity maximum at the center of the spacer where an active layer (such as a quantum dot or quantum well) may be located. Although the cavity with the spacer thickness exactly equal to $\lambda/2n_l$ works, the optimum cavity design (i.e., the one with maximum Q-factor and also maximum Q/V ratio) has the spacer slightly thinner than $\lambda/2n_l$. Thus, in one specific embodiment, the optimum spacer thickness is equal to an optimum value of $0.44\lambda/n_l$.

The devices of the present invention operate with an electric field intensity maximum at the center of the cavity where the active layer is located, thus providing strong interaction between the cavity field and the active layer. At the same time, the devices provide a high-refractive-index material at the center of the cavity, thus enabling the active layer to be embedded at the center of the cavity, where the field intensity is maximum. The devices also provide an increase in the ratio Q/V relative to all previously known microposts.

BRIEF DESCRIPTION OF THE DRAWING FIGURES

FIG. 1b is a graph of refractive index and corresponding electric field intensity along the longitudinal length of the device shown in FIG. 1a.

FIG. 2b is a graph of refractive index and corresponding electric field intensity along the longitudinal length of the device shown in FIG. 2a.

FIG. 3b is a graph of refractive index and corresponding electric field intensity along the longitudinal length of the device shown in FIG. 3a.

FIG. 4b is a graph of the refractive index and associated electric field intensity along the length of the micropost microcavity of FIG. 4a.

DETAILED DESCRIPTION

Figure 4A:
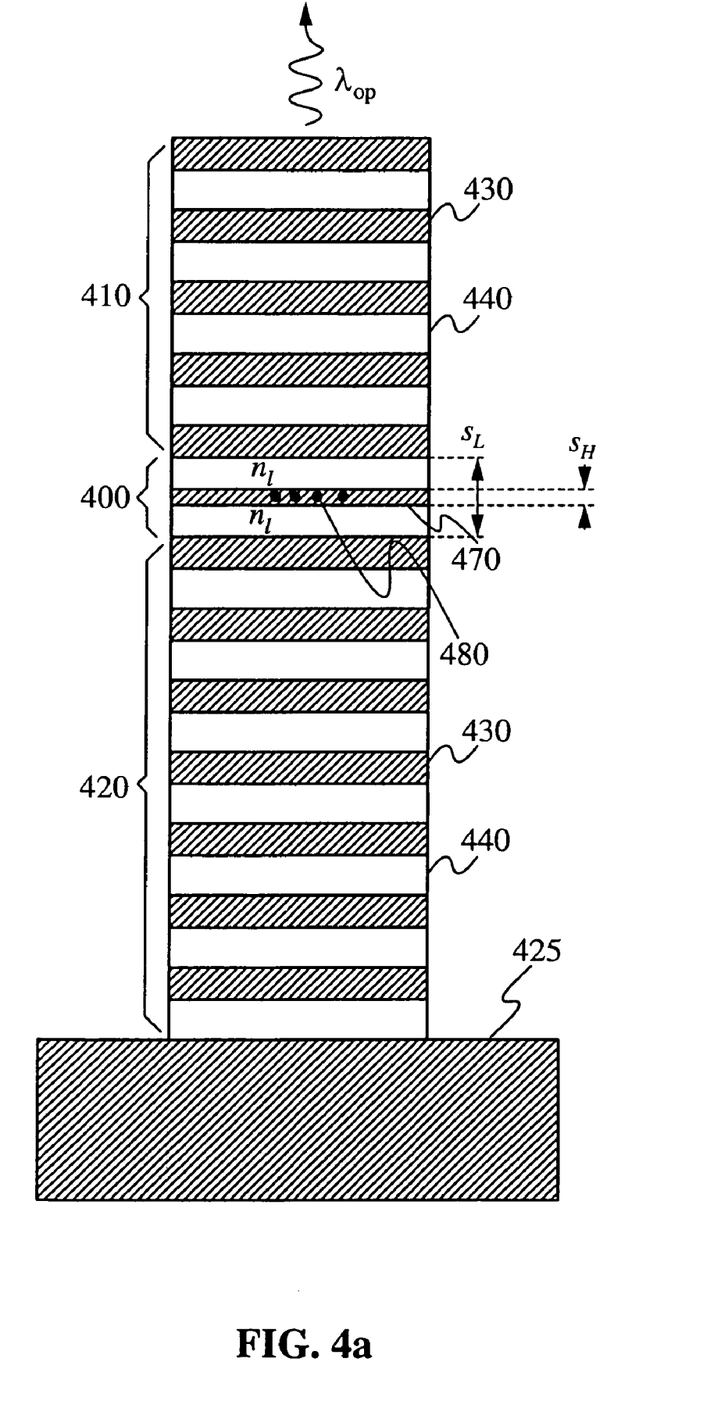
FIG. 4a is a cross-sectional view of an embodiment of a micropost microcavity according to the invention, wherein the low-index spacer thickness is approximately half a wavelength and comprises a high refractive-index subspacer.

One embodiment of a micropost microcavity according to the invention is shown in FIG. 4a. The device of finite diameter is designed to operate at a predetermined operational wavelength, $\lambda_{op} < \lambda$, where $\lambda$ is a predetermined design wavelength equal to the cavity mode wavelength measured in free space, when the cavity diameter is infinite (planar cavity case). A spacer region 400 is sandwiched between two dielectric mirrors 410 and 420, and the device may be fabricated on a substrate layer 425 using conventional fabrication processes. Dielectric mirrors 410, 420 are distributed-Bragg-reflectors (DBRs), constructed by stacking alternating high-refractive index layers 430 and low-refractive index layers 440 on top of each other. The low index layers 440 are composed of a material having a refractive index $n_l$, while the high index layers 430 are composed of a material having a refractive index $n_h$, where $n_l < n_h$. The alternating low index and high index layers have alternating quarter-wave thicknesses $\lambda/4n_l$ and $\lambda/4n_h$, respectively. The mirrors are optimized for the planar case rather than for the actual operating wavelength.

As is well known in the art, many material systems can be used to fabricate suitable DBR mirrors. Preferably, the GaAs/AlAs material system is used for the construction of the DBR mirrors, i.e., the high index material 430 is GaAs and the low index material 440 is AlAs, because this material system provides high Q factors and small mode volumes with a small number of mirror pairs. In this case, the refractive indices of the low- and high-refractive-index regions are $n_l = 2.94$ and $n_h = 3.57$, corresponding to AlAs and GaAs, respectively. At an wavelength of $\lambda = 999.6$ nm, for example, the thicknesses of GaAs and AlAs mirror layers 430 and 440 are 70 nm and 85 nm, respectively, corresponding to quarter-wavelength stack in a planar cavity. The number of mirror pairs on top and bottom may be, for example, and 30, respectively. Various other material systems may be used in other embodiments of the invention. For example, the high refractive index material for the DBR mirrors and the subspacer may be GaAs, while the low refractive index material for the mirrors and spacer is $Al_xGa_{1-x}As$ where $0 < x < 1$. (This includes AlAs as a special case when $x = 1$. Typically, $x > 0.9$.) The active layer (quantum dots or quantum wells) may be composed of $In_yGa_{1-y}As$, $0 < y < 1$, embedded in GaAs. In another embodiment, the high refractive index material for the DBR mirrors and subspacer may again be GaAs, while the low refractive index material for the mirrors and spacer is $AlO_x$ (aluminum oxide). The active layer may be In$_y$Ga$_{1-y}$As, 0<y<1, embedded in the GaAs. In yet another material system, the high refractive index material for the DBR mirrors and subspacer is again GaAs, while the low refractive index material for the mirrors and spacer is Al$_x$Ga$_{1-x}$As where 0>x>1. (This includes AlAs as a special case when x=1. Typically, x>0.9.) The active layer in this case may be a In$_x$Ga$_{1-x}$As$_y$N$_{1-y}$ quantum well, 0<x<1, 0<y<1, embedded in GaAs. These material systems may be selected in part to provide emission at wavelengths typically from around 900 nm to 1000 nm, or emission at wavelengths from 1300 nm to 1550 nm (e.g., for telecom applications).

Preferably, the thickness of the subspacer is between 0.57 and 0.86 of the quarter wavelength $\lambda/(4n_h)$. Preferably, the thickness of the spacer is approximately a half wavelength, which for the purposes of this description will be defined to mean $0.4\lambda/n_l$ to $0.6\lambda/n_l$. More preferably, the spacer is slightly thinner that a half wavelength, and most preferably, the spacer thickness is $0.44\lambda/n_l$. This thickness is approximately equal to $\lambda/4n_l+\lambda/4n_h$, i.e., equal to the thickness of one DBR mirror pair. (In our example, the DBR mirror pair thickness is 70+85=155 nm, and the optimum low-index spacer thickness is 150 nm.)

The number of mirror pairs used for the top and bottom mirrors is selected as in standard VCSEL designs. The number of mirror pairs on the bottom is larger, so that the light exits on top (i.e., the laser emits on top). If there was no asymmetry, the structure would emit equally on top and on bottom, which is undesirable. Typical numbers that give good results are 15 and 30 layers. Those skilled in the art will appreciate that other numbers may be used as well.

The spacer 400 is made of the low index material having refractive index $n_l$ containing at its center a subspacer layer 470 of the high-index material having refractive index $n_h$. The spacer has an approximately half-wavelength thickness $s_L=\lambda/2n_l$ (e.g, an optimum value that is slightly less than half a wavelength), and the subspacer layer has a thickness $s_H<\lambda/4n_h$. Since the total thickness of the spacer is $\lambda/2n_l$, and the high index subspacer thickness is less than $\lambda/4n_h$, the total thickness of the two low index layers of the spacer is at least $\lambda/2n_l-\lambda/4n_h$. If the subspacer is centered, then the two low index layers have equal thickness of half this total, or at least $(\lambda/2n_l-\lambda/4n_h)/2=\lambda/4n_l-\lambda/8n_h$. In the case where the GaAs/AlAs material system is used, the subspacer layer 470 is composed of GaAs and the rest of the spacer is composed of AlAs. The spacer with the subspacer layer at its center may be fabricated by depositing a first portion of the low-index material, depositing the subspacer layer of high index material, then depositing a second portion of the low-index material. Embedded within the GaAs subspacer layer is an active region 480, such as InAs or InGaAs quantum dots or quantum wells, or InGaAsN quantum wells. The active region (e.g., comprising quantum dots or quantum wells) is placed in the high-refractive-index subspacer layer. The active layer may comprise, for example, a single layer of quantum dots, a single quantum well, or multiple quantum wells.

Standard procedures that are used to fabricate conventional microposts and VCSELs may be used to make the devices of the present invention. For example, the whole structure may be grown in a vertical direction (DBR mirror layers, spacer bottom, subspacer bottom, active region, subspacer top, spacer top, DBR mirror layers) using the same molecular beam epitaxy (MBE) process. This gives a planar microcavity structure. A lithography process performed on the top surface of such structure is used to define locations of finite-diameter posts and their cross-sections (i.e., we define the etching mask). Posts are then constructed by dry etching, using the previously defined etching mask. For electrically pumped structures, extra fabrication steps are required to define contacts, as is well known in the art.

Micropost diameters can range from fractions of a micron to several microns. For single photon sources, we are typically interested in smaller diameters, from 0.4 μm to 0.5 μm. VCSELs are usually made with larger diameters, but can also be made with smaller diameters.

The micropost microcavity device may be rotationally symmetric around its vertical axis, or may have a discrete rotational or reflection symmetry (e.g., it may have a square or elliptical cross-section). Confinement of light is achieved by the combined action of distributed Bragg reflection (DBR) in the longitudinal direction (along the vertical axis of FIG. 4a), and total internal reflection (TIR) in the transverse direction (along the horizontal axis of FIG. 4a).

Figure 4B:
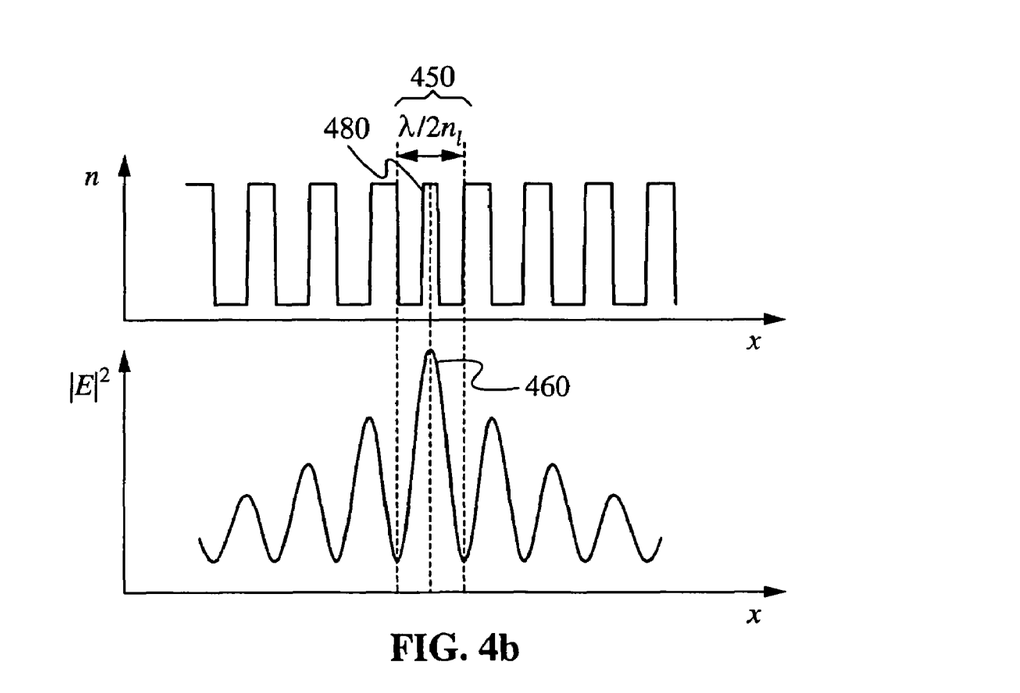

FIG. 4b is a graph of the refractive index and associated electric field intensity along the length of the micropost microcavity of FIG. 4a. Because the high index subspacer layer 480 is less than a quarter wavelength in thickness, the electric field intensity in the device behaves as if the spacer 450 were composed entirely of low index material. Consequently, the electric field intensity is a maximum 460 at the center of the half-wavelength thick spacer 450, and the maximum occurs within the high-index subspacer 480. The device therefore provides a low mode volume and a maximum field intensity in a high index region.

To illustrate the advantages enjoyed by devices built in accordance with the present invention, consider as an example a cylindrical micropost microcavity device having an operational wavelength of $\lambda_{op}$=880 nm GaAs and AlAs mirror layers with thicknesses 70 nm and 85 nm, and a post diameter D=0.4 μm. (Due to the finite post diameter of 0.4 microns, the operating wavelength is blue-shifted, i.e., decreased, from the operating wavelength of the structure with infinite diameter, i.e., λ about 1000 nm.) In the conventional device shown in FIG. 1a, the Q/V ratio is maximized when the thickness of high refractive index spacer 100 is exactly equal to one optical wavelength ($\lambda/n_h$=280 nm). For this set of parameters, a Q factor of 10,000 can be achieved together with a mode volume of 1.6 cubic wavelengths of light in the high refractive index material (i.e., V=1.6$(\lambda/n_h)^3$). In contrast, consider now a device designed according to the principles of the present invention, as shown in FIG. 4a. The high index spacer layer 470 in this instance has a thickness of less than 70 nm and is positioned in the center of low index spacer layer 400 which has a thickness slightly below one half-wavelength 150 nm). This device provides more than twofold increase in the Q/V value, for the same micropost diameter (D=0.4 μm) and the same number of mirror pairs. (Due to the structure configuration, the number of mirror pairs on top is now equal to 15.5, since the final top layer is GaAs.) The new design can lead to the quality factor as high as 20,000, together with a mode volume of 1.5$(\lambda/n_h)^3$. The reduction in the mode volume is a result of a decrease in the cavity size (from one-wavelength to half-wavelength), while the increase in the Q factor comes from a better mode confinement, mostly in the transverse direction. In the new cavity design, the defect mode is pulled into the band gap from the dielectric band, and it concentrates more of its electric field energy in high-refractive-index regions, as opposed to the one-wavelength-cavity, where the mode is pulled into the band gap from the air band. This results in a better confinement in the transverse direction.

Moreover, the new design is robust and insensitive to small variations in the thickness of the GaAs subspacer. For example, using the above illustration as an example, an increase in the thickness of the high-refractive-index subspacer from 40 nm to 60 nm does not degrade the Q factor significantly. The electric field reaches its maximum value in the center of the GaAs subspacer, where an active layer can be placed.

The microcavities of the present invention have many useful applications. The improved microcavities may be used in place of conventional microcavities to provide increased performance. They may also be used for applications where conventional microcavities proved inadequate. The devices of the present invention may be used to construct single photon sources, single dot lasers, or devices for strong coupling between a single quantum dot and the cavity field which can be used as components of photonic integrated circuits, quantum computers, quantum networks, or quantum cryptographic systems. They are also useful to create VCSEL-type lasers. Such novel VCSELs have the same DBR micropost type structure shown in FIG. 4a. Conventional VCSELs usually have a one wavelength thick high-refractive index spacer region with quantum wells embedded at its center. For example, VCSELs emitting at 980 nm are conventionally built by embedding InGaAs quantum wells into one-wavelength thick high-refractive index GaAs spacers, and the spacer is in turn sandwiched between GaAs and AlAs mirrors, as in the conventional micropost design. Similarly, VCSELs emitting at 1300 nm-1550 nm are conventionally built by embedding InGaAsN quantum wells into one-wavelength thick high-refractive index GaAs spacers, and the spacer is in turn sandwiched between GaAs and AlAs mirrors, as in the conventional micropost design. The new cavity designs of the present invention can be used to improve any of these conventional VCSELs and will reduce their threshold. Due to the increase in the quality factor and a simultaneous decrease in the mode volume, there is a stronger interaction between the field and the active region, which are quantum wells in this case.

What is claimed is:

1. An optical device designed for operating at a predetermined operating wavelength $\lambda_{op} < \lambda$, where $\lambda$ is a predetermined design wavelength, the device comprising:
a) two quarter-wave stacks, wherein the quarter-wave stacks comprise alternating layers of a low-index material having refractive index $n_l$ and a high-index material having refractive index $n_h$, where $n_l < n_h$, wherein the alternating layers have alternating quarter-wave thicknesses $\lambda/4n_l$ and $\lambda/4n_h$, and
b) a spacer layer sandwiched between the two quarter-wave stacks, wherein the spacer layer has a thickness of approximately $\lambda/2n_l$ and comprises:
i) two spacer layers of low-index material having refractive index $n_l$ and
ii) a subspacer layer of high-index material having refractive index $n_h$ and a thickness less than $\lambda/4n_h$, wherein the subspacer layer is sandwiched between the two spacer layers of low-index material.

2. The optical device of claim 1 further comprising an active region embedded within the subspacer layer.

3. The optical device of claim 2 wherein the active region comprises a quantum dot.

4. The optical device of claim 2 wherein the active region comprises a quantum well.

5. The optical device of claim 1 wherein the thickness of the spacer layer is between $0.4\lambda/2n_l$ and $0.6\lambda/2n_l$.

6. The optical device of claim 5 wherein the thickness of the spacer layer is $0.44\lambda/2n_l$.

7. A VCSEL comprising:
a) two dielectric mirrors; and
b) a cavity between the two dielectric mirrors comprising an active region embedded in a high index subspacer layer sandwiched between two low index spacer layers,
wherein the two low index spacer layers have an index of refraction $n_l$,
wherein the high index subspacer layer has an index of refraction $n_h > n_l$,
wherein the cavity has a thickness of approximately $\lambda/2n_l$,
wherein the subspacer has a thickness less than $\lambda/4n_h$, where $\lambda$ is a predetermined design wavelength.

8. The optical device of claim 7 wherein the active region comprises a quantum dot.

9. The optical device of claim 7 wherein the active region comprises a quantum well.

10. The optical device of claim 7 wherein the thickness of the spacer layer is between $0.4\lambda/2n_l$ and $0.6\lambda/2n_l$.

11. The optical device of claim 7 wherein the thickness of the spacer layer is $0.44\lambda/2n_l$.

12. An optical device comprising:
a) two distributed Bragg reflector mirrors;
b) a spacer layer sandwiched between the Bragg reflector mirrors, wherein the spacer layer comprises:
i) two spacer layers of a low-index material having refractive index $n_l$;
ii) a subspacer layer of a high-index material having refractive index $n_h > n_l$ sandwiched between the two spacer layers of the low-index material; and
iii) an active layer embedded in the subspacer layer;
wherein the spacer layer has a thickness less than $\lambda/2n_l$ where $\lambda$ is a predetermined design wavelength.

13. The device of claim 12 wherein the subspacer layer has a thickness less than $\lambda/4n_h$.

14. The device of claim 12 wherein the Bragg reflector mirrors are optimized to the design wavelength $\lambda$, and wherein the device operates at an operational wavelength $\lambda_{op} < \lambda$.

15. The device of claim 12 wherein the active layer comprises quantum dots.

16. The device of claim 12 wherein the active layer comprises quantum wells.

17. The device of claim 12 wherein the high-index material is GaAs and the low-index material is AlAs.

* * * * *